(12) United States Patent
Chen

(10) Patent No.: US 12,610,672 B1
(45) Date of Patent: Apr. 21, 2026

(54) THROUGH-HOLE LED LAMP BEAD

(71) Applicant: Dongguan Yisheng Electronic Technology Co., Ltd., Dongguan (CN)

(72) Inventor: Zhiyao Chen, Taoyuan County (CN)

( * ) Notice: Subject to any disclaimer, the term of this patent is extended or adjusted under 35 U.S.C. 154(b) by 0 days.

(21) Appl. No.: 19/313,116

(22) Filed: Aug. 28, 2025

(30) Foreign Application Priority Data

Jul. 30, 2025　(CN) .......................... 202521614726.4

(51) Int. Cl.
| | |
|---|---|
| *H10H 20/85* | (2025.01) |
| *H10H 20/856* | (2025.01) |
| *H10H 20/857* | (2025.01) |
| *H10H 29/24* | (2025.01) |

(52) U.S. Cl.
CPC ........ *H10H 20/856* (2025.01); *H10H 20/857* (2025.01); *H10H 29/24* (2025.01)

(58) Field of Classification Search
CPC ..... H10H 20/856; H10H 20/857; H10H 29/24
See application file for complete search history.

(56) References Cited

U.S. PATENT DOCUMENTS

| | | | | | |
|---|---|---|---|---|---|
| 4,209,358 | A | * | 6/1980 | DiLeo | H01L 24/83 |
| | | | | | 257/E23.044 |
| 4,375,606 | A | * | 3/1983 | Di Leo | H01L 24/33 |
| | | | | | 257/676 |
| 5,218,233 | A | * | 6/1993 | Takahashi | H01L 25/0753 |
| | | | | | 313/499 |

| | | | | | |
|---|---|---|---|---|---|
| 5,998,925 | A | * | 12/1999 | Shimizu | H01J 29/20 |
| | | | | | 313/503 |
| 6,518,600 | B1 | * | 2/2003 | Shaddock | H10H 20/854 |
| | | | | | 257/E33.059 |
| 6,921,927 | B2 | * | 7/2005 | Ng | H10H 20/8585 |
| | | | | | 257/745 |
| 8,487,326 | B2 | * | 7/2013 | Chan | H10H 20/856 |
| | | | | | 257/91 |
| 2001/0026011 | A1 | * | 10/2001 | Roberts | H10H 20/854 |
| | | | | | 257/E33.059 |

(Continued)

FOREIGN PATENT DOCUMENTS

| | | | | | |
|---|---|---|---|---|---|
| CN | 101660680 | A | * | 3/2010 | ................ F21S 2/00 |
| CN | 101771031 | A | * | 7/2010 | ......... H01L 2224/05 |

(Continued)

*Primary Examiner* — Ida M Soward
(74) *Attorney, Agent, or Firm* — Nicholas Makridakis

(57) ABSTRACT

A through-hole LED (light-emitting diode) lamp bead is provided, including a lead frame, and a light-transmissive colloid arranged on the lead frame. The lead frame includes a first lead and a second lead which are nonpolar; an end portion, extending toward the light-transmissive colloid, of the first lead is provided with a reflective cup; and a first light-emitting chip is connected into the reflective cup. End portions of the first lead and the second lead are provided with more than one group of oppositely distributed first connection portions and second connection portions, a second light-emitting chip is connected between the first connection portion and the second connection portion in each group, inner sides of the first connection portion and the second connection portion are respectively provided with a first protection portion and a second protection portion, and a coating layer is formed at an end portion of the light-transmissive colloid.

11 Claims, 8 Drawing Sheets

(56)                  References Cited

U.S. PATENT DOCUMENTS

| | | | | |
|---|---|---|---|---|
| 2002/0056806 A1* | 5/2002 | Bechtel | ................ | G02B 5/0215 |
| | | | | 250/214.1 |
| 2003/0001166 A1* | 1/2003 | Waalib-Singh | ...... | H10H 20/856 |
| | | | | 257/E33.072 |
| 2006/0033117 A1* | 2/2006 | Takekuma | .......... | H10H 20/857 |
| | | | | 257/99 |
| 2011/0186865 A1* | 8/2011 | Chan | .................. | H01L 25/0753 |
| | | | | 257/E33.056 |
| 2012/0018751 A1* | 1/2012 | Negley | ................ | H10W 90/00 |
| | | | | 257/89 |

FOREIGN PATENT DOCUMENTS

| | | | | | |
|---|---|---|---|---|---|
| CN | 202660477 U | * | 1/2013 | .............. | F21V 17/00 |
| CN | 204204852 U | * | 3/2015 | ........... | H01L 25/075 |
| CN | 219735040 U | * | 9/2023 | ........... | H10H 20/856 |
| JP | 2001077427 A | * | 3/2001 | ........ | H01L 2224/48 |
| KR | 20090049466 A | * | 5/2009 | | |

* cited by examiner

THROUGH-HOLE LED LAMP BEAD

TECHNICAL FIELD

The present disclosure relates to the field of LED lamp beads, and in particular to a through-hole LED (light-emitting diode) lamp bead.

BACKGROUND

Light-emitting diode (LED for short) is a solid-state light source device based on the electroluminescence principle of a semiconductor PN junction. A core portion of a through-hole LED lamp bead is a chip composed of a P-type semiconductor and an N-type semiconductor, and there is a transition layer between the P-type semiconductor and the N-type semiconductor, which is called the PN junction. In the PN junctions of some semiconductor materials, when the injected minority carriers recombine with the majority carriers, excess energy will be released in the form of light, thereby directly converting electric energy into light energy.

As one of the main forms of LED products, through-hole LED lamp beads are directly inserted into a printed circuit board (PCB) through leads and fastened by soldering, which has a wide range of applications. A basic structure of the through-hole LED lamp bead includes: a lead frame, an LED chip, a bonding wire, an encapsulation colloid and leads. In some special occasions, such as cafes, bars, stages or temples, candles are needed to heighten atmosphere, but a candle wick of a conventional candle will produce smoke when burning, and there is also a potential danger of fire. Therefore, LED candle lamps imitating candles have begun to appear on the market.

However, in decorative lighting scenes that need to simulate the dynamic flame effect, such as a candle-imitating lamp, the LED lamp beads used in the prior art still have some defects, among which, LED lamp beads in existing candle-imitating lamps have a relatively simple light-emitting structure, while the conventional candle-imitating lamp beads mostly adopt a single-layer light-emitting structure, which has a fixed light-emitting direction and a single light intensity distribution. This makes it difficult to replicate the flickering, scattering, and dynamic movement of a real candle flame. As a result, the simulation effect appears rigid, with noticeable light spots, and the imitation of the burning flame by light-emitting is poor, which reduces user experience and decorative aesthetics. Therefore, how to improve the dynamic simulation ability of a through-hole LED lamp bead to a candle flame through structural innovation has become an urgent technical problem in this field.

SUMMARY

To solve the foregoing defects, an objective of the present disclosure is to provide a through-hole LED lamp bead, thereby solving the technical problem that an existing candle-imitating LED lamp bead in the background has poor effect of simulating burning fire, which affects user experience and decorative aesthetics.

The objective of the present disclosure is implemented through the following ways.

A through-hole LED lamp bead includes a lead frame, where a light-transmissive colloid is arranged on the lead frame. The lead frame is composed of a first lead and a second lead which are nonpolar, an end portion, extending towards the light-transmissive colloid, of the first lead is provided with a reflective cup, an emission cavity is formed in the reflective cup, a first light-emitting chip is connected into the reflective cup, and the first light-emitting chip is electrically connected to the second lead by a bonding wire. End portions, extending towards the light-transmissive colloid, of the first lead and the second lead are provided with more than one group of oppositely distributed first connection portions and second connection portions, and a second light-emitting chip is connected between the first connection portion and the second connection portion in each group. Inner sides of the first connection portion and the second connection portion are respectively provided with a first protection portion and a second protection portion by bending. The first light-emitting chip and the second light-emitting chip are arranged in a same vertical line to form an alternate light-emitting structure. Soldering portions are formed at end portions, passing through the light-transmissive colloid, of the first lead and the second lead, and a coating layer is formed at the end portion, close to the soldering portion, of the light-transmissive colloid by injection molding, where the coating layer may be black or other colors.

Further in the foregoing description, a first light-transmissive portion is formed at an end portion, close to the first light-emitting chip, of the light-transmissive colloid, and a second light-transmissive portion is formed at an end portion, close to the second light-emitting chip, of the light-transmissive colloid.

A light-transmissive path can be provided for a dual-layer light-emitting structure by arranging the first light-transmissive portion and the second light-transmissive portion corresponding to the first light-emitting chip and the second light-emitting chip on the light-transmissive colloid, so that the light from the first light-emitting chip and the second light-emitting chip emit through different light-transmissive regions to enhance stratification of light intensity distribution and the ability for dynamic changes and improve the simulation effect of flickering and scattering characteristics of a candle flame.

Further in the foregoing description, the first connection portion and the second connection portion are provided with a first connection notch and a second connection notch, respectively, and the second light-emitting chip is mounted between the first connection notch and the second connection notch.

By arranging special connection notches in the first connection portion and the second connection portion, accurate mounting and positioning can be provided for the second light-emitting chip to ensure electrical connection stability of the second light-emitting chip with the first lead and the second lead, thereby ensuring the reliable operation of the dual-layer light-emitting structure and improving the stability of the overall light-emitting effect.

Further in the foregoing description, opposite inner side surfaces of the first connection portion and the second connection portion are respectively formed with a protruding first contact portion and a protruding second contact portion, and the first connection notch and the second connection notch are formed in inner sides of the first contact portion and the second contact portion, respectively.

By arranging the protruding contact portions on the inner sides of the first connection portion and the second connection portion and forming the connection notches on this basis, the contact area with the second light-emitting chip can be increased, and the tightness and reliability of electrical connection can be improved. In addition, the protruding structure can limit the second light-emitting chip to prevent the mounting of the second light-emitting chip from deviating. This ensures that a light-emitting direction of the second light-emitting chip is coordinated with that of the first light-emitting chip, thereby optimizing the light distribution of the dual-layer light-emitting structure and enhancing the dynamic simulation effect.

Further in the foregoing description, the first connection portion and the second connection portion are symmetrically arranged on inner side surfaces of the first lead and the second lead, so that the first protection portion and the second protection portion are symmetrically distributed. The first protection portion and the second protection portion protrude and extend toward back surfaces of the first connection portion and the second connection portion by bending, and positioning surfaces for supporting and making contact with the second light-emitting chip are formed on the first protection portion and the second protection portion.

The first protection portion and the second protection portion formed by bending can play a positioning role in the soldering of the second light-emitting chip, reduce a phenomenon of position deviation of the second light-emitting chip, and ensure the connection stability and reliability of the second light-emitting chip with the first lead and the second lead. In addition, as the bent first protection portion and the second protection portion are in contact with the second light-emitting chip, a positioning surface can play a heat conduction role for the second light-emitting chip and can play a heat dissipation role for the second light-emitting chip.

Further in the foregoing description, the first protection portion and the second protection portion form an L shaped by bending.

Further in the foregoing description, a light-emitting portion is formed on the second light-emitting chip, where the light-emitting portion can extend towards the first light-emitting chip, or the light-emitting portion extends towards the soldering portion.

By designing the light-emitting portion capable of extending towards different directions, a light exit direction of the second light-emitting chip can be diversified, complementing or superimposing with the light from the first light-emitting chip. Therefore, the dynamic flickering and jumping characteristics of a candle flame are simulated, the rigid simulation effect caused by the fixed light direction of a conventional single-layer light-emitting structure is avoided, and the simulation capability for the flickering and jumping properties of a real flame is improved.

Further in the foregoing description, the light-transmissive colloid is formed by injection molding of epoxy resin to encapsulate one end of the first lead and one end of the second lead.

The end portion of the first lead is encapsulated by using epoxy resin injection molding process to effectively protect the first light-emitting chip, the second light-emitting chip and the bonding wire. In addition, the epoxy resin has good light transmittance, which can reduce the loss during light transmission process, ensure the efficient light emission of the first light-emitting chip and the second light-emitting chip, and improve the overall light-emitting efficiency.

Further in the foregoing description, a curved light-transmissive surface is formed at an end portion, away from the soldering portion, of the light-transmissive colloid, and an opening of the reflective cup extends towards the curved light-transmissive surface.

The curved light-transmissive surface is provided to scatter the light from the first light-emitting chip and the second light-emitting chip.

Further in the foregoing description, the first light-emitting chip is connected to the second lead and the first lead via positive and negative electrodes, and the second light-emitting chip is electrically connected to the first lead and the second lead via positive and negative electrodes.

The present disclosure has beneficial effects that the first light-emitting chip and the second light-emitting chip are vertically arranged to form a dual-layer or multi-layer light-emitting structure. When the lead is connected to an external IC controller, the first light-emitting chip and the second light-emitting chip are controlled by an IC to alternately flicker with intervals at different times and different frequencies in a scanning manner to simulate jumping and flickering characteristics of a real candle flame. The problem of rigid simulation effect caused by a conventional fixed light-emitting mode is avoided, and the simulation degree of dynamic simulation is improved. The arrangement of the first light-emitting chip and the second light-emitting chip enables the light to exit from different levels and directions, thereby enhancing stratification and dynamic change ability of the light. The arrangement of the first protection portion and the second protection portion can ensure connection stability and reliability of the second light-emitting chip and reduce the phenomenon of deviation or poor contact of the second light-emitting chip. In addition, the first protection portion and the second protection portion are in contact with the second light-emitting chip and perform heat conduction and dissipation. Moreover, a coating layer is formed at the end portion, close to the soldering portion, of the light-transmissive colloid by injection molding, and the coating layer may be set to black to simulate a black appearance of a candle wick, thereby further improving the decorative aesthetics and the use experience.

Figure 1:
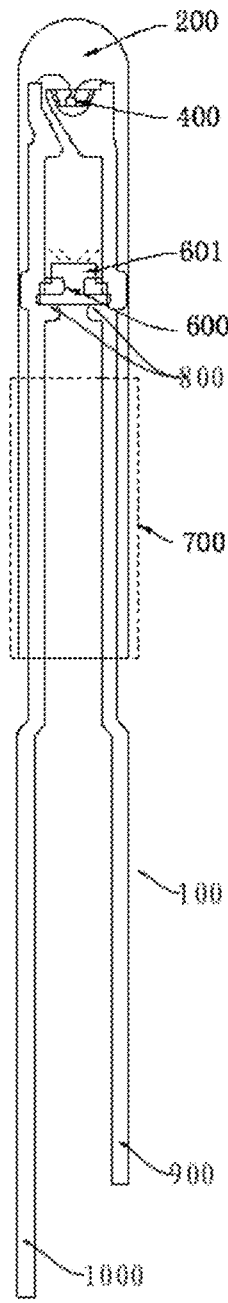
FIG. 1 is a diagram of an overall structure according to an embodiment.
Figure 2:
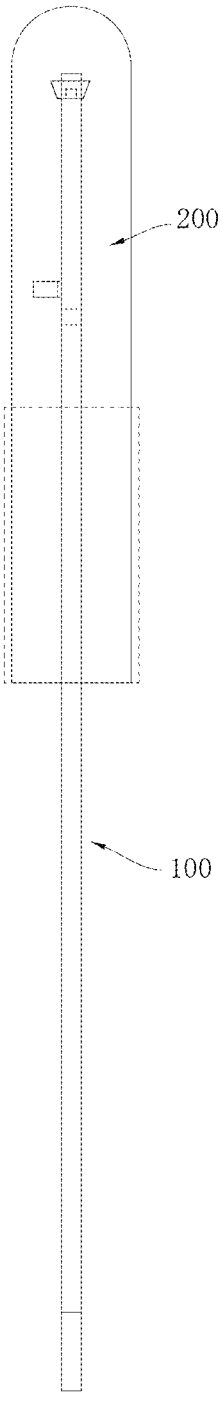
FIG. 2 is a diagram of an overall structure according to an embodiment.
Figure 3:
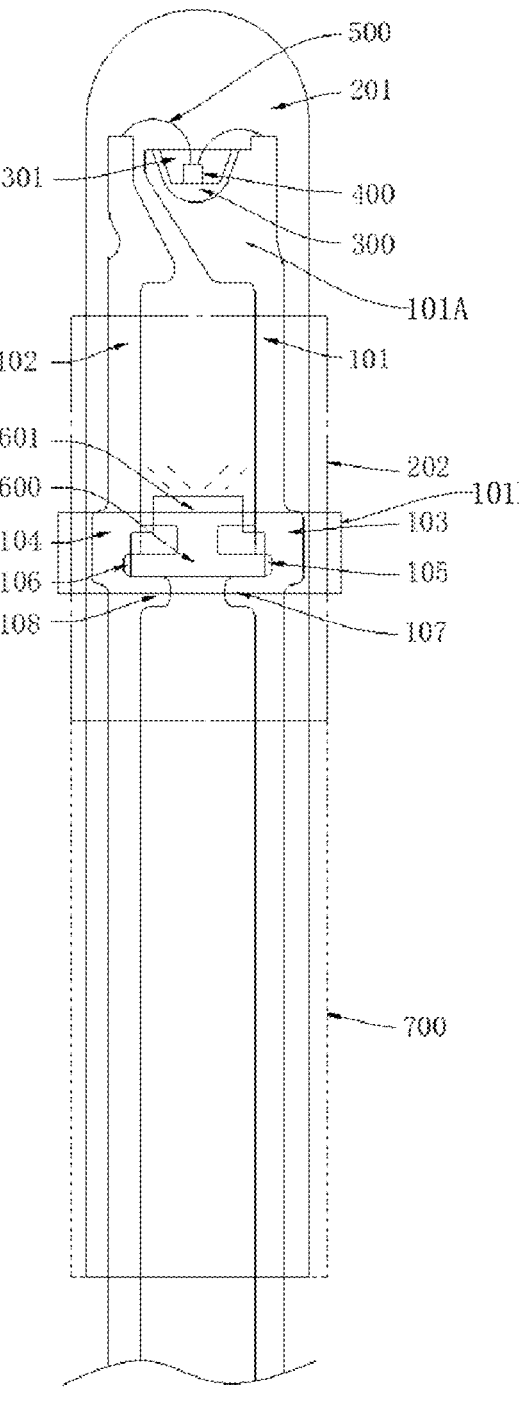
FIG. 3 is a diagram of a partial structure according to an embodiment.
Figure 4:
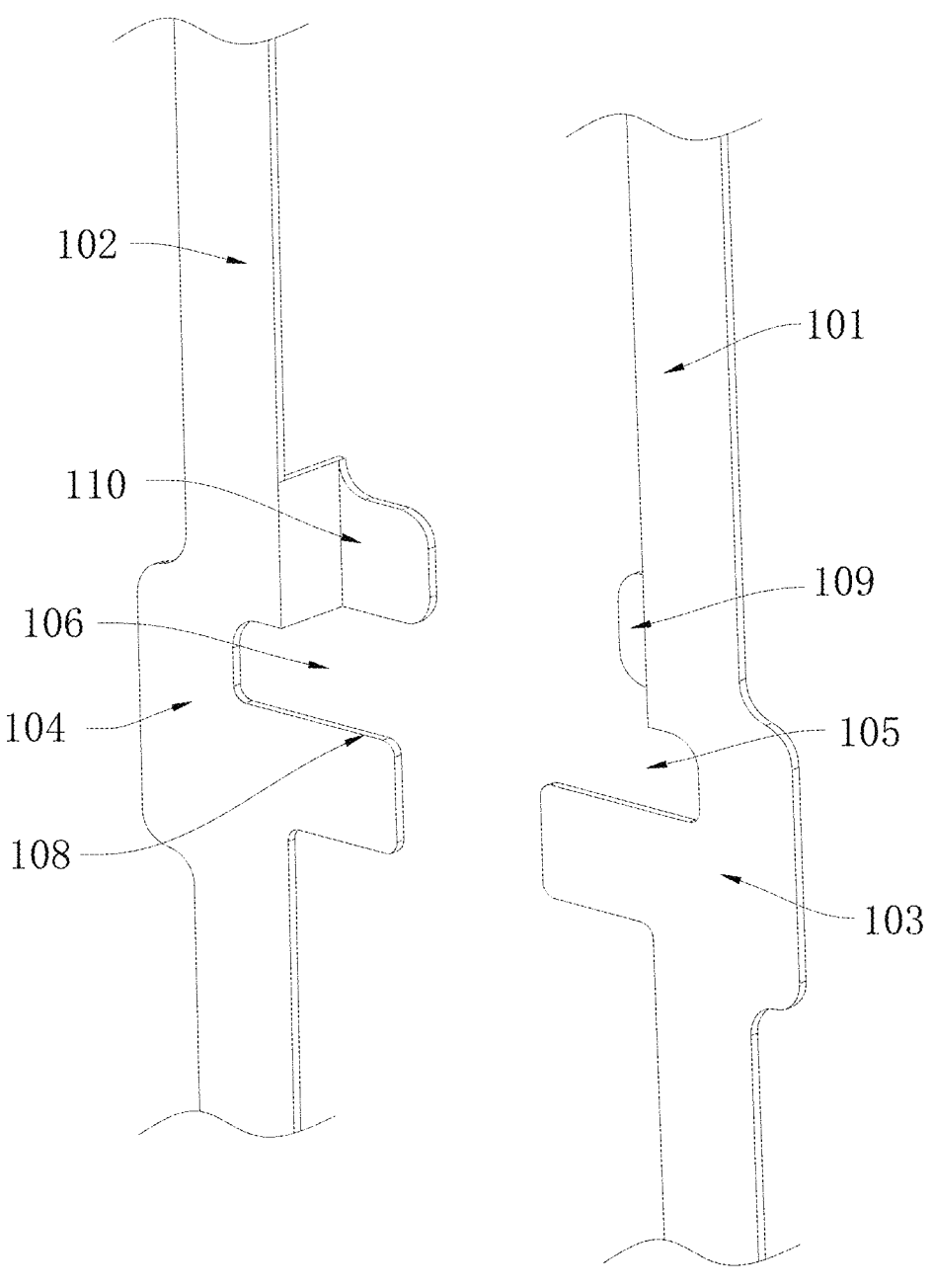
FIG. 4 is a diagram of partial structures of a first lead and a second lead in a first direction according to an embodiment.
Figure 5:
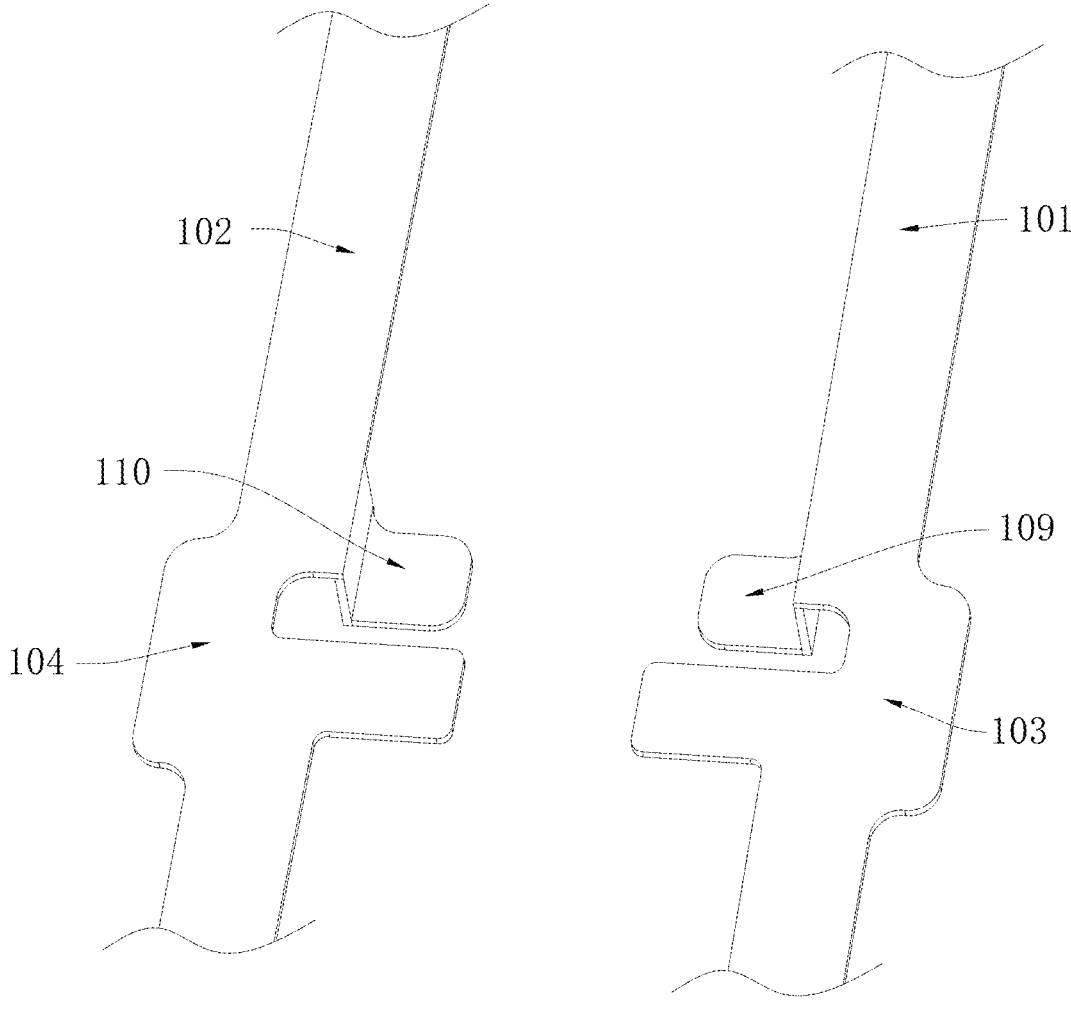
FIG. 5 is a diagram of partial structures of a first lead and a second lead in a second direction according to an embodiment.

Reference numerals in the drawings are as follows:
100—lead frame; 101—first lead; 102—second lead; 103—first connection portion; 104—second connection portion; 105—first connection notch; 106—second connection notch; 107—first contact portion; 108—second contact portion; 109—first protection portion; 110—second protection portion;
200—light-transmissive colloid; 201—first light-transmissive portion; 202—second light-transmissive portion;
300—reflective cup; 301—emission cavity;

400—first light-emitting chip; 500—bonding wire; 600—
second light-emitting chip; 700—coating layer.

DETAILED DESCRIPTION OF THE
EMBODIMENTS

The present disclosure is further described in detail below
with reference to accompanying drawings and specific
implementations.

To make the technical problems to be solved by the
present disclosure, technical solutions and beneficial effects
more clearly, this solution is further described in detail
below with reference to accompanying drawings and
embodiments.

In the description of the present disclosure, it should be
understood that the orientation or positional relationship
indicated by terms "length", "width", "upper", "lower",
"front", "back", "left", "right", "vertical", "horizontal",
"top", "bottom", "inside" and "outside" is based on the
orientation or positional relationship shown in the drawings
only for convenience of description of the present invention
and simplification of description rather than indicating or
implying that the apparatus or element referred to must have
a particular orientation, be constructed and operate in a
particular orientation, and thus are not to be construed as
limiting the present disclosure.

Embodiment 1

In this embodiment, with reference to FIG. 1 to FIG. 5 and
FIG. 8, a through-hole LED lamp bead includes a lead frame
100, where a light-transmissive colloid 200 is arranged on
the lead frame 100. The lead frame 100 is composed of a first
lead 101 and a second lead 102 which are nonpolar, an end
portion 101A, extending towards the light-transmissive col-
loid 200, of the first lead 101 is provided with a reflective
cup 300, an emission cavity 301 is formed in the reflective
cup 300, a first light-emitting chip 400 is connected into the
reflective cup, and the first light-emitting chip 400 is elec-
trically connected to the second lead 102 by a bonding wire
500. End portions 101B, extending towards the light-trans-
missive colloid 200, of the first lead 101 and the second lead
102 are provided with more than one group of oppositely
distributed first connection portions 103 and second con-
nection portions 104, and a second light-emitting chip 600
is connected between the first connection portion 103 and
the second connection portion 104 in each group. Inner sides
of the first connection portion 103 and the second connec-
tion portion 104 are respectively provided with a first
protection portion 109 and a second protection portion 110
by bending. The first light-emitting chip 400 and the second
light-emitting chip 600 are arranged in a same vertical line
to form an alternate light-emitting structure. Soldering por-
tions 800 are formed at end portions, passing through the
light-transmissive colloid 200, of the first lead 101 and the
second lead 102, and a coating layer 700 is formed at the end
portion, close to the soldering portion 800, of the light-
transmissive colloid 200 by injection molding.

In some embodiments, the first lead 101 and the second
lead 102 are provided with one or more groups of first
connection portions 103 and second connection portions
104. One second light-emitting chip 600 is connected to one
group of first connection portion 103 and second connection
portion 104, a group of second light-emitting chips 600 and
one first light-emitting chip 400 form a dual-layer alternate
light-emitting structure, so that a connected IC control
terminal can alternately control the first light-emitting chip 400 and the second light-emitting chip 600 to alternately
flicker with intervals to simulate jumping and flickering
characteristics of a real candle flame.

In some other embodiments, the first lead 101 and the
second lead 102 are provided with multiple groups of first
connection portions 103 and second connection portions
104. One second light-emitting chip 600 is connected to
each group of first connection portion 103 and second
connection portion 104, multiple groups of second light-
emitting chips 600 and one first light-emitting chip 400 form
an alternate light-emitting structure, and an IC control
terminal can alternately control light-emitting chips to alter-
nately flicker with intervals.

A first light-transmissive portion 201 is formed at an end
portion, close to the first light-emitting chip 400, of the
light-transmissive colloid 200, and a second light-transmis-
sive portion 202 is formed at an end portion, close to the
second light-emitting portion 600, of the light-transmissive
colloid 200.

A light-transmissive path can be provided for a dual-layer
light-emitting structure by arranging the first light-transmis-
sive portion 201 and the second light-transmissive portion
202 corresponding to the first light-emitting chip 400 and the
second light-emitting chip 600 on the light-transmissive
colloid 200, so that the light from the first light-emitting chip
400 and the second light-emitting chip 600 can emit through
different light-transmissive regions to enhance stratification
of light intensity distribution and the ability for dynamic
changes and improve the simulation effect of flickering and
scattering characteristics of a candle flame.

Specifically, when the first light-emitting chip 400 emits
light, the first light-transmissive portion 201 emits light by
transmission. When the second light-emitting chip 600 emits
light, the second light-transmissive portion 202 emits by
transmission, so that light emission by transmission of
different light transmission portions can enhance the simu-
lation of the stratification and dynamic change ability of the
burning light intensity distribution of the candle lamp, and
enhance the simulation experience of use.

The first connection portion 103 and the second connec-
tion portion 104 are provided with a first connection notch
105 and a second connection notch 106, respectively, and the
second light-emitting chip 600 is mounted between the first
connection notch 105 and the second connection notch 106.

By arranging special connection notches in the first con-
nection portion 103 and the second connection portion 104,
accurate mounting and positioning can be provided for the
second light-emitting chip 600 to ensure electrical connec-
tion stability of the second light-emitting chip 600 with the
first lead 101 and the second lead 102, thereby ensuring the
reliable operation of the dual-layer light-emitting structure
and improving the stability of the overall light-emitting
effect.

Opposite inner side surfaces of the first connection por-
tion 103 and the second connection portion 104 are respec-
tively formed with a protruding first contact portion 107 and
a protruding second contact portion 108, and the first con-
nection notch 105 and the second connection notch 106 are
formed in inner sides of the first contact portion 107 and the
second contact portion 108, respectively.

By arranging the protruding contact portions on the inner
sides of the first connection portion 103 and the second
connection portion 104 and forming the connection notches
on this basis, the contact area with the second light-emitting
chip 600 can be increased, and the tightness and reliability
of electrical connection can be improved. In addition, the
protruding structure can limit the second light-emitting chip 600 to prevent the mounting of the second light-emitting chip 600 from deviating. This ensures that a light-emitting direction of the second light-emitting chip 600 is coordinated with that of the first light-emitting chip 400, thereby optimizing the light distribution of the dual-layer light-emitting structure and enhancing the dynamic simulation effect.

The first connection portion 103 and the second connection portion 104 are symmetrically arranged on the inner side surfaces of the first lead 101 and the second lead 102, so that the first protection portion 109 and the second protection portion 110 are symmetrically distributed. The first protection portion 109 and the second protection portion 110 protrude and extend towards back surfaces of the first connection portion 103 and the second connection portion 104 by bending, and positioning surfaces for supporting and making contact with the second light-emitting chip 600 are formed on the first protection portion 109 and the second protection portion 110. The first protection portion 109 and the second protection portion 110 form an L shaped by bending.

The first protection portion 109 and the second protection portion 110 formed by bending can play a positioning role in the soldering of the second light-emitting chip 600, reduce a phenomenon of position deviation of the second light-emitting chip 600, and ensure the connection stability and reliability of the second light-emitting chip 600 with the first lead 101 and the second lead 102. In addition, as the bent first protection portion 109 and the second protection portion 110 are in contact with the second light-emitting chip 600, a positioning surface can play a heat conduction role for the second light-emitting chip 600 and can play a heat dissipation role for the second light-emitting chip 600.

Specifically, a light-emitting portion 601 is formed on the second light-emitting chip 600, the light-emitting portion 600 can extend towards the first light-emitting chip 400, that is, the light-emitting portion 600 extends upwards.

By designing the light-emitting portion 601 capable of extending towards different directions, a light exit direction of the second light-emitting chip 600 can be diversified, complementing or superimposing with the light from the first light-emitting chip 400. Therefore, the dynamic flickering and jumping characteristics of a candle flame are simulated, the rigid simulation effect caused by the fixed light direction of a conventional single-layer light-emitting structure is avoided, and the simulation capability for the flickering and jumping properties of a real flame is improved.

Specifically, in some embodiments, the light-emitting portion 601 of the second light-emitting chip 600 can be arranged upward or downward, so that a heat dissipation angle of light emission is different, and different use requirements can be satisfied.

The translucent colloid 200 is formed by injection molding of epoxy resin to encapsulate one end of the first lead 101 and one end of the second lead 102. The end portion of the first lead is encapsulated by using epoxy resin injection molding process to effectively protect the first light-emitting chip 400, the second light-emitting chip 600 and the bonding wire 500. In addition, the epoxy resin has good light transmittance, which can reduce the loss during light transmission process, ensure the efficient light emission of the first light-emitting chip 400 and the second light-emitting chip 600, and improve the overall light-emitting efficiency.

A curved light-transmissive surface is formed at an end portion, away from the soldering portion 800, of the light-transmissive colloid 200, and an opening of the reflective cup 300 extends towards the curved light-transmissive surface. The curved light-transmissive surface is provided to scatter the light from the first light-emitting chip 400 and the second light-emitting chip 600.

The first light-emitting chip 400 is connected to the second lead 102 and the first lead 101 via positive and negative electrodes 100C, and the second light-emitting chip 600 is electrically connected to the first lead 101 and the second lead 102 via positive and negative electrodes 100C.

Specifically, the LED lamp bead in this embodiment employs one first light-emitting chip and one second light-emitting chip to form a dual-layer light-emitting structure capable of alternately flickering with intervals.

The specific operation principle of the embodiment is as follows.

As an example, for example, the first lead 101 and the second lead 102 are electrically connected to an external IC control board through a first soldering portion 900 and a second soldering portion 1000, and an IC controller is configured to provide positive power supply to the first lead 101 or the second lead 102 and negative power supply to the first lead 101 or the second lead 102.

Specifically, when the IC controller scans and controls the first lead 101 to a negative electrode and the second lead 102 to be a positive electrode to energize, the first light-emitting chip 400 is energized to emit light. In this case, the second light-emitting chip 600 is in an off state, and only the first light-emitting chip 400 emits light.

When the IC controller scans and controls the first lead 101 to be the positive electrode and the second lead 102 to be the negative electrode to energize, the second light-emitting chip 600 is energized to emit light. In this case, the first light-emitting chip 400 is in an off state, and only the second light-emitting chip 600 emits light.

Therefore, through scanning by the IC controller and repeatedly executing the alternate flickering of the first light-emitting chip 400 or the second light-emitting chip 600, the flickering, scattering, and dynamic jumping characteristics of a real candle flame can be simulated. The first light-emitting chip 400 and the second light-emitting chip 600 can alternately flicker with intervals at different times and frequencies in a scanning manner through IC control, thereby improving the simulation degree of the candle flame burning flickering. In addition, a coating layer 700 is formed at an end portion, close to the soldering portion 800, of the light-transmissive colloid 200 by injection molding, and the coating layer may be black, thereby simulating a black appearance of a candle wick, visually enhance the similarity with the real candle, and further enhance the decorative aesthetics and use experience.

Embodiment 2

Figure 6:
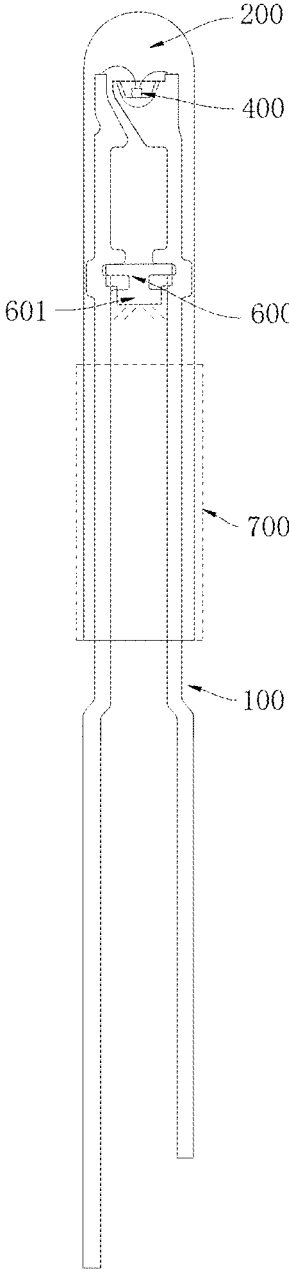
FIG. 6 is a diagram of a structure according to Embodiment 2.

In this embodiment, with reference to FIG. 6, a difference between Embodiment 2 and Embodiment 1 is only that the light-emitting portion 601 extends towards the soldering portion 800, that is, the light-emitting portion 601 extends downwards.

Embodiment 3

Figure 7:
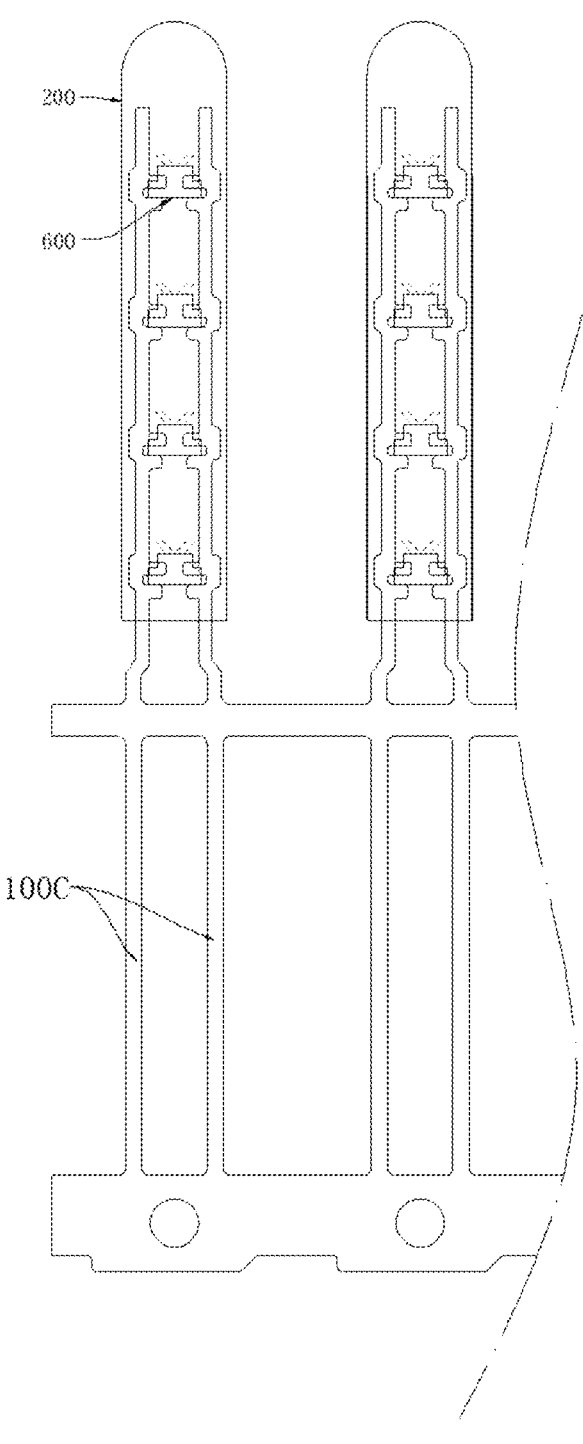
FIG. 7 is a diagram of a structure according to Embodiment 3.
Figure 8:
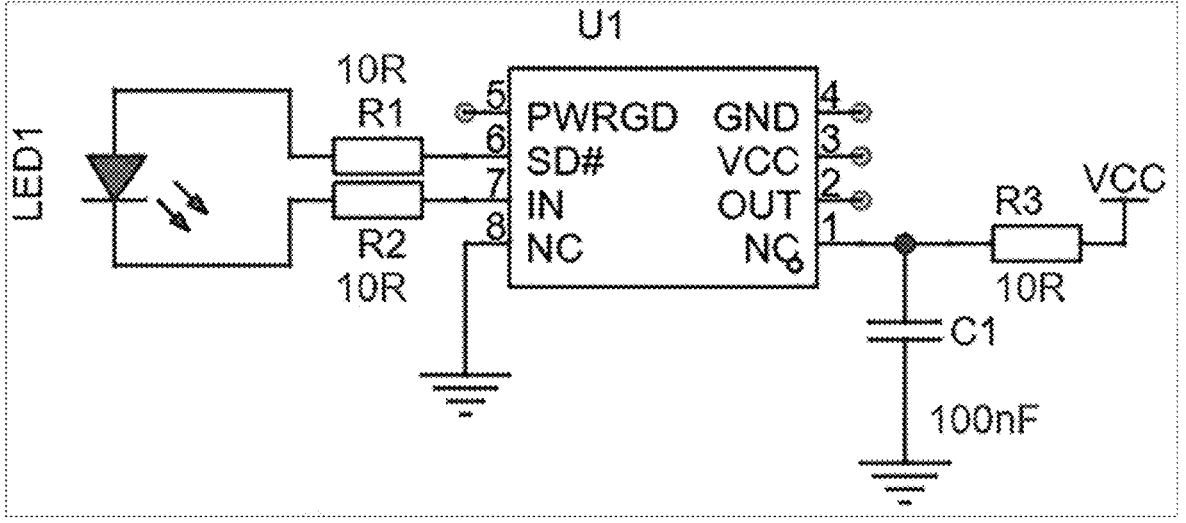
FIG. 8 is a diagram of a control circuit of an LED lamp bead according to an embodiment.

In this embodiment, with reference to FIG. 7, a difference between Embodiment 3 and Embodiment 1 is only that a structural arrangement of the first light-emitting chip is removed, so that the first pin and the second pin are only provided with multiple groups of second light-emitting chips. Specifically, in this embodiment, four groups of second light-emitting chips are employed, and the four groups of second light-emitting chips are controlled by an IC controller in a scanning manner to alternately flicker with intervals, so that the flickering with intervals at different times and frequencies can be achieved, the simulation degree of burning flicker of the candle flame can be improved, and the flickering, scattering and dynamic jumping characteristics of a real candle flame are simulated.

The foregoing is only the preferred embodiment of the present disclosure, and is not intended to limit the present disclosure in any form. Although the present disclosure is disclosed in the preferred embodiment, it is not used to limit the present disclosure. Those skilled in the art can make some changes or modifications to equivalent embodiments by using the technical contents disclosed above without departing from the scope of the technical solution of the present disclosure, but any simple modifications, equivalent changes and modifications to the foregoing embodiments without departing from the technical solution of the present disclosure are within the scope of the technical solution of the present disclosure.

What is claimed is:

1. A through-hole LED (light-emitting diode) lamp bead, comprising:

a light-transmissive colloid arranged on a lead frame, wherein the lead frame comprises a first lead and a second lead which are nonpolar; an end portion, extending towards the light-transmissive colloid, of the first lead and the end portion provided with a reflective cup;

a first light-emitting chip connected into the reflective cup, wherein the first light-emitting chip is electrically connected to the second lead by a bonding wire;

end portions, extending towards the light-transmissive colloid, of the first lead and the second lead, wherein the end portions are provided with more than one group of oppositely distributed first connection portions and second connection portions;

a second light-emitting chip connected between the first connection portion and the second connection portion in each group, wherein inner sides of the first connection portion and the second connection portion are respectively provided with a first protection portion and a second protection portion by bending;

the first light-emitting chip and the second light-emitting chip arranged in a same vertical line;

a soldering portion is formed at end portion passing through the light-transmissive colloid of each of the first lead and the second lead; and a coating layer formed at the end portion, close to the soldering portion of the light-transmissive colloid by injection molding.

2. The through-hole LED lamp bead according to claim 1, wherein a first light-transmissive portion is formed at an end portion, close to the first light-emitting chip of the light-transmissive colloid, and a second light-transmissive portion is formed at an end portion, close to the second light-emitting chip of the light-transmissive colloid.

3. The through-hole LED lamp bead according to claim 1, wherein the first connection portion and the second connection portion are provided with a first connection notch and a second connection notch, respectively; and the second light-emitting chip is mounted between the first connection notch and the second connection notch.

4. The through-hole LED lamp bead according to claim 3, wherein opposite inner side surfaces of the first connection portion and the second connection portion are respectively formed with a protruding first contact portion and a protruding second contact portion; and the first connection notch and the second connection notch are formed in inner sides of the first contact portion and the second contact portion, respectively.

5. The through-hole LED lamp bead according to claim 1, wherein the first connection portion and the second connection portion are symmetrically arranged on inner side surfaces of the first lead and the second lead, so that the first protection portion and the second protection portion are symmetrically distributed; the first protection portion and the second protection portion protrude and extend toward back surfaces of the first connection portion and the second connection portion by bending, wherein positioning surfaces for supporting and making contact with the second light-emitting chip are formed on the first protection portion and the second protection portion.

6. The through-hole LED lamp bead according to claim 5, wherein the first protection portion and the second protection portion form an L shaped by bending.

7. The through-hole LED lamp bead according to claim 1, wherein the light-transmissive colloid is formed by injection molding of epoxy resin to encapsulate one end of the first lead and one end of the second lead.

8. The through-hole LED lamp bead according to claim 1, wherein a curved light-transmissive surface is formed at an end portion away from the soldering portion of the light-transmissive colloid, and an opening of the reflective cup extends towards the curved light-transmissive surface.

9. The through-hole LED lamp bead according to claim 8, wherein the first light-emitting chip is connected to the second lead and the first lead via positive and negative electrodes, and the second light-emitting chip is electrically connected to the first lead and the second lead via positive and negative electrodes.

10. The through-hole LED lamp bead according to claim 8, wherein a light-emitting portion is formed on the second light-emitting chip, the light-emitting portion is capable of extending towards the first light-emitting chip, or the light-emitting portion extends towards the soldering portion.

11. The through-hole LED lamp bead according to claim 1, wherein the coating layer is black.

* * * * *